United States Patent
Lee

(10) Patent No.: US 7,397,130 B2
(45) Date of Patent: Jul. 8, 2008

(54) SEMICONDUCTOR DEVICES WITH CONTACT HOLES SELF-ALIGNED IN TWO DIRECTIONS

(75) Inventor: Woon-Kyung Lee, Gyeonggi-do (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 0 days.

(21) Appl. No.: 11/481,503

(22) Filed: Jul. 6, 2006

(65) Prior Publication Data

US 2007/0026657 A1 Feb. 1, 2007

(30) Foreign Application Priority Data

Jul. 6, 2005 (KR) .................... 10-2005-0060888

(51) Int. Cl.
*H01L 23/48* (2006.01)
(52) U.S. Cl. .................. 257/774; 257/E21.507
(58) Field of Classification Search ......... 438/584–629, 438/666, 671, 675; 257/332, 377, 774, E23.143, 257/E23.145, E23.151, E23.168, E23.17, 257/E23.175, E21.507
See application file for complete search history.

(56) References Cited

U.S. PATENT DOCUMENTS

| | | | | |
|---|---|---|---|---|
| 6,562,651 | B2 * | 5/2003 | Chung et al. ............... | 438/98 |
| 6,750,101 | B2 * | 6/2004 | Lung ........................ | 438/257 |
| 6,897,145 | B2 * | 5/2005 | Park ......................... | 438/637 |
| 7,045,849 | B2 * | 5/2006 | Chen et al. ................ | 257/314 |
| 2004/0046189 | A1 * | 3/2004 | Chu et al. ................. | 257/266 |
| 2004/0266170 | A1 * | 12/2004 | Yun .......................... | 438/622 |

FOREIGN PATENT DOCUMENTS

| | | |
|---|---|---|
| JP | 2001-189424 | 7/2001 |
| KR | 1020010065191 A | 7/2001 |
| KR | 1020020056018 A | 7/2002 |
| KR | 1020050002074 A | 1/2005 |
| KR | 1020050024593 A | 3/2005 |

OTHER PUBLICATIONS

Notice to file a Response/Amendment to the Examination Report in Korean Application No. 10-2005-0060888; Date of mailing Jun. 12, 2006.
Translations of Notice to file a Response/Amendments to the Examination Report in Korean Application No. 10-2005-0060888; Date of mailing Jun. 12, 2006.

* cited by examiner

*Primary Examiner*—W. David Coleman
*Assistant Examiner*—Khiem D. Nguyen
(74) *Attorney, Agent, or Firm*—Myers Bigel Sibley & Sajovec, P.A.

(57) ABSTRACT

A method of forming a semiconductor device can include forming a plurality of gate structure patterns including gates and first mask patterns stacked on a semiconductor substrate, the gate structure patterns being spaced apart from each other and extending in a first direction, forming a first interlayer insulating layer covering the gate structure patterns, forming a plurality of second mask patterns extending in a second direction crossing the first direction and spaced apart from each other, and etching the first interlayer insulating layer to form a contact hole, self-aligned to the first and second mask patterns, in at least one contact region defined by a neighboring pair of the first mask patterns and a neighboring pair of the second mask patterns. Related devices are also disclosed.

10 Claims, 21 Drawing Sheets

SEMICONDUCTOR DEVICES WITH CONTACT HOLES SELF-ALIGNED IN TWO DIRECTIONS

CROSS-REFERENCE TO RELATED APPLICATION

This application claims priority to Korean Patent Application No. 2005-60888, filed in the Korean Intellectual Patent Office on Jul. 6, 2005, the disclosure of which is hereby incorporated herein.

FIELD OF THE INVENTION

The present invention relates to semiconductor devices and methods of forming semiconductor devices, and more particularly, to semiconductor devices having a self-aligned contact (SAC) hole and methods of forming semiconductor devices.

BACKGROUND

It is known to include contact holes in semiconductor devices for electrically connecting upper and lower conductors. In detail, the contact hole can be formed through an insulating layer interposed between the upper and lower conductors to define a penetration path connecting the upper and lower conductors, and a conductive material can be formed in the contact hole to electrically connect the upper and lower conductors.

With high integration of semiconductor devices, the diameter of contact holes and the alignment margin between contact holes and lower conductors may be reduced. Further, there is a need for a contact hole having a smaller diameter than that formed by a photolithography process. To follow these trends in semiconductor devices, a self-aligned contact (SAC) hole has been introduced.

In some conventional approaches in forming a SAC hole, a conductive layer and a hard mask layer are sequentially formed on a substrate, and these layers are patterned to form a stacked structure having a conductor and a hard mask pattern. An insulating spacer layer is formed on sidewalls of the conductor and the hard mask pattern, and an interlayer insulating layer is formed on the entire surface of the substrate. Here, the interlayer insulating layer has a larger etching rate than the hard mask pattern and the insulating spacer layer. Then, a SAC hole is formed through the interlayer insulating layer in such a manner that the SAC hole has a sidewall aligned with the hard mask pattern and the insulating spacer layer.

The above conventional method of forming the SAC hole can provide advantages in manufacturing high-density integrated semiconductor device since the SAC hole can be self-aligned in a direction perpendicular to a sidewall of the hard mask pattern. Even when regions where contact holes will be formed are misaligned during photolithography, the SAC holes can be precisely formed between hard mask patterns in a direction perpendicular to the sidewall of the hard mask patterns. However, since the SAC holes may not be self-aligned in a direction that is parallel to the sidewall of the hard mask pattern, the SAC holes can be formed at misaligned positions in the direction parallel to the sidewall of the hard mask pattern. Therefore, contacts may not be densely arranged in the direction of the sidewall of the hard mask pattern, thereby possibly producing negative effects on device integration.

SUMMARY

Embodiments of the present invention can provide methods of forming a semiconductor device with a SAC hole and devices so formed. The methods can include forming an insulating layer on a substrate, forming a plurality of first patterns and a plurality of second patterns in the form of a lattice structure, and etching the insulating layer to form a contact hole. The contact hole is formed in at least one region defined by a neighboring pair of the first patterns and a neighboring pair of the second patterns, and the contact hole is self-aligned with the first patterns and the second patterns. Since the contact hole is self-aligned with the first patterns and other patterns crossing the first patterns, the contact hole can be formed at a desired position. Further, the distance between densely arranged contact holes could be uniformly maintained, thereby allowing high-density integration.

In other embodiments of the present invention, methods of forming semiconductor devices include forming a plurality of gate structure patterns having gates and first mask patterns that are stacked on a semiconductor substrate. The gate structure patterns extend in a first direction and are spaced apart from each other. A first interlayer insulating layer covers the gate structure patterns, and a plurality of second mask patterns extend in a second direction crossing the first direction and are spaced apart from each other. The first interlayer insulating layer is etched to form a contact hole. The contact hole is formed in at least one contact region defined by a neighboring pair of the first mask patterns and a neighboring pair of the second mask patterns, and the contact hole is self-aligned with the first mask patterns and the second mask patterns.

In some embodiments, the method further includes forming device isolation layers on the semiconductor device. The device isolation layers extend in the second direction and define active regions. The second mask patterns are formed in alignment with the device isolation layers. Therefore, the contact hole can be self-aligned with the mask patterns on the gates and the device isolation layers, such that the contact hole can be precisely formed at a desired position on the semiconductor substrate. The contact hole can be self-aligned in the direction of a gate electrode.

In other embodiments, the method further includes forming a second interlayer insulating layer to cover the second mask patterns. In this case, the contact hole is formed by etching the second interlayer insulating layer and the first interlayer insulating layer. The contact hole includes a first contact hole formed between the first mask patterns and under the first mask patterns and a second contact hole formed on top of the first contact hole in connection with the first contact hole. The first contact hole is self-aligned with the first mask patterns and the second mask patterns, and the second contact hole is self-aligned with the second mask patterns.

In further embodiments, the first mask patterns and the second mask patterns include an etch stop layer for etching of a silicon oxide layer. The etch stop layer is a silicon nitride layer, a multi-layer with a silicon oxide layer/a silicon nitride layer, or an undoped polysilicon layer. Meanwhile, the first mask patterns and the second mask patterns may be formed of materials having different etch selectivity.

In further embodiments, sidewall insulating layers are formed on sidewalls of the gates. The sidewall insulating layers may be insulating spacer layers. When the gates are formed of polysilicon, the sidewall insulating layers may be formed by oxidizing the polysilicon. Therefore, insulation between contact plugs and gate electrodes can be prevented from degradation even when the mask patterns are damaged during etching for the contact hole.

In further embodiments, the second mask patterns can be removed by performing overall etching on the semiconductor substrate for planarization.

In still other embodiments of the present invention, semiconductor devices include a semiconductor substrate, a plurality of device isolation layers defining active regions on the semiconductor substrate, and a plurality of gate structure patterns having gates and first mask patterns that are stacked on the semiconductor substrate, the gate structure patterns being spaced apart from each other and extending in a first direction. The semiconductor devices further include an interlayer insulating layer covering the gate structure patterns, a plurality of second mask patterns formed on the interlayer insulating layer, the second mask patterns extending in a second direction and spaced apart from each other; and a conductive layer formed in at least one contact hole defined by a neighboring pair of the first mask patterns and a neighboring pair of the second mask patterns, the contact hole being self-aligned with the first mask patterns and the second mask patterns.

In even other embodiment of the present invention, semiconductor devices include a semiconductor substrate, a plurality of device isolation layers defining active regions on the semiconductor substrate, a plurality of structures having gates and first mask patterns that are stacked on the semiconductor substrate, the gate structure patterns being spaced apart from each other and extending in a first direction, an interlayer insulating layer covering the gate structure patterns, and a contact plug filled in a contact hole formed through the interlayer insulating layer to expose the semiconductor device. The contact hole includes a first contact hole formed at least between the first mask patterns and under the first mask patterns and a second contact hole formed in an upper portion of the first mask patterns in connection with the first contact hole. The first contact hole has a first sidewall self-aligned with a surface of the first mask pattern in the first direction, a second sidewall self-aligned with a surface of a neighboring first mask pattern facing the first sidewall in parallel, a third sidewall formed in a second direction crossing the first direction, and a fourth sidewall spaced apart from the third sidewall in parallel. The second contact hole has a fifth sidewall outside the first sidewall, a sixth sidewall outside the second sidewall, and the third and fourth sidewalls. The second contact hole extends in the second direction. The second contact hole is larger than the first contact hole. The device isolation layers extend in the second direction, and the third and fourth sidewalls are aligned with the device isolation layers.

DESCRIPTION OF EMBODIMENTS ACCORDING TO THE INVENTION

Figure 1A:
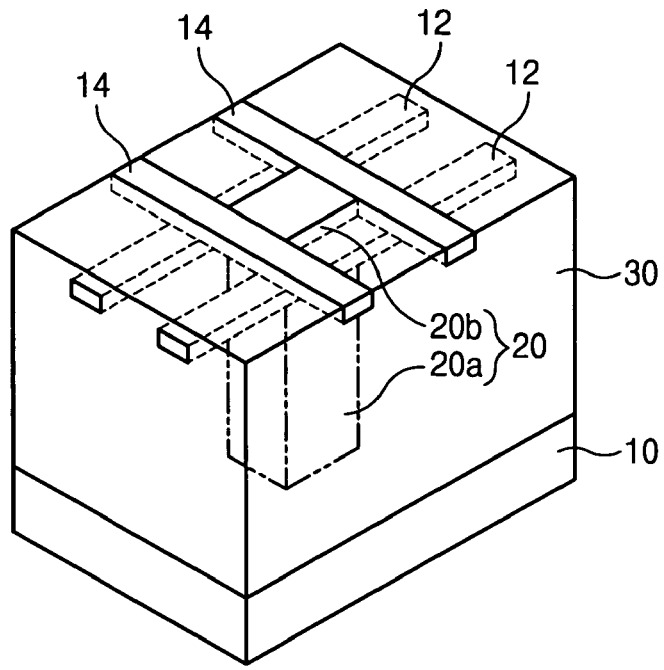
FIGS. 1A through 1D are schematic views showing self-aligned contact (SAC) structures according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be further understood that the term "outside" includes configuration where a portion of an underlying layer, such as a dielectric layer, is not covered by an overlying structure, such as a photo-resist pattern.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIGS. 1A through 1D are schematic views showing self-aligned contact (SAC) structures according to some embodiments of the present invention.

Referring to FIG. 1A, an example of a SAC structure is shown according to some embodiments of the present invention. A plurality of first material patterns 12 and a plurality of second material patterns 14 cross each other to form a lattice structure above a substrate 10. The first and second material patterns 12 and 14 can be in contact with each other. An interlayer insulating layer 30 may be formed on the substrate 10. Further, other interlayer insulating layers can be additionally formed to cover the first material patterns 12 and/or the second material patterns 14. The first material patterns 12 (two are shown) are spaced apart from each other and extend in a first direction, and the second patterns 14 (two are shown) are spaced apart from each other and extend in a second direction perpendicular to the first direction. In this structure, a contact hole 20 is formed in a region confined by the first material patterns 12 and the second material patterns 14. The contact hole 20 may include a first contact hole 20a and a second contact hole 20b. The first contact hole 20a is formed in the interlayer insulating layer 30 between and under the first material patterns 12, and the second contact hole 20b is formed in the insulating layer 30 between the second material patterns 14 and connected to a top portion of the first contact hole 20a.

A plurality of contact holes may be formed along the first and second directions. A conductive material is filled in the contact hole 20 to form a contact plug in order to electrically connect the substrate 10 and an upper portion of the interlayer insulating layer 30.

When the interlayer insulating layer 30 formed of a silicon oxide is etched, the first and second material patterns 12 and 14 may function as etch stop layers having a good etch stop characteristic. Such an etch stop layer may be a silicon nitride layer, a silicon oxide/silicon nitride stacked layer, or an undoped polysilicon layer. Meanwhile, the first material patterns 12 and the second material patterns may be formed of materials having different etch selectivity.

In this way, the first contact hole 20a is self-aligned with both the first and second material patterns 12 and 14. On the contrary, the second contact hole 20b is self-aligned only to the second material patterns 14 but is not self-aligned with the first material pattern 12.

Figure 1B:
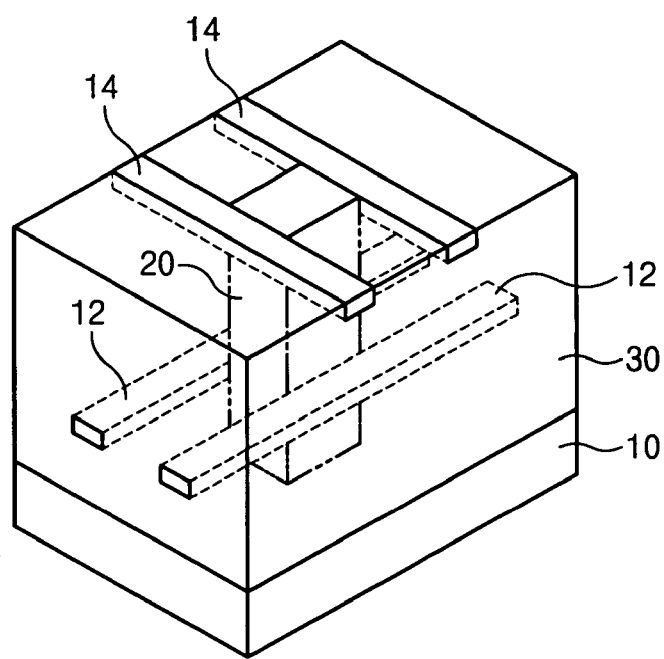
Figure 1C:
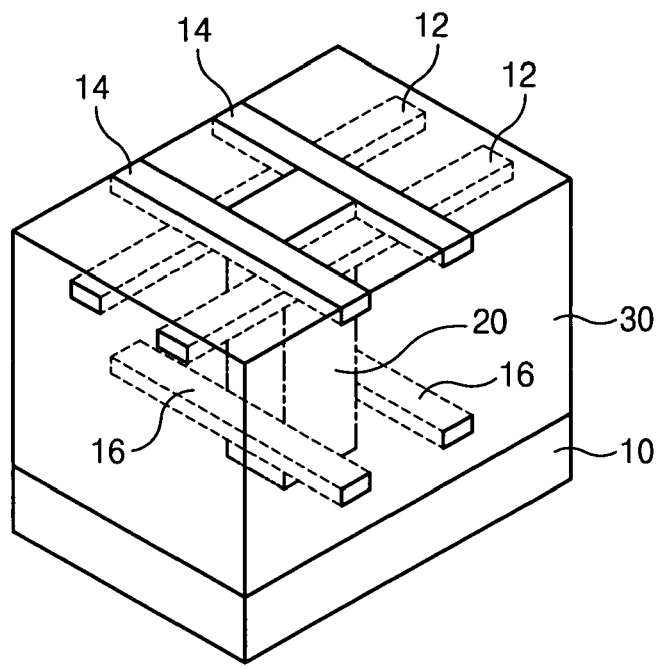
Figure 1D:
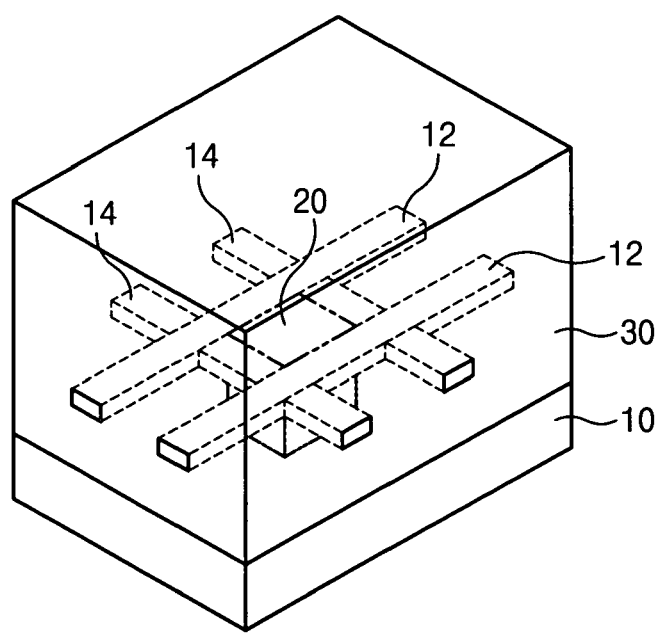

FIGS. 1B through 1D show modified examples of the SAC structure shown in FIG. 1A. Referring to FIG. 1B, unlike the SAC structure of FIG. 1A, first material patterns 12 may not be in contact with second material patterns 14. An interlayer insulating layer 30 is formed on the first material patterns 12 and the second material patterns 14 are formed on the interlayer insulating layer 30. Referring to FIG. 1C, third material patterns 16 may be additionally formed. The third material patterns 16 are aligned with first material patterns 12 or second material patterns 14, thereby allowing more precise self-alignment when forming a contact hole 20. Referring to FIG. 1D, bottom surfaces of first and second material patterns 12 and 14 may be in contact with an interlayer insulating layer 30 on the same plane. The first material patterns 12 and the second material patterns 14 may be formed using the same stacked layer. In this case, a self-aligned structure in both directions can be formed without increase in height. Further, the first and second material patterns 12 and 14 can be simply formed by performing deposition and photo processes one time.

Although embodiments of the present invention discuss a non-volatile memory device to describe the scope of the present invention more specifically, the present invention is not limited to the non-volatile memory device. The present invention may be applied to other memory devices.

Figure 2A:
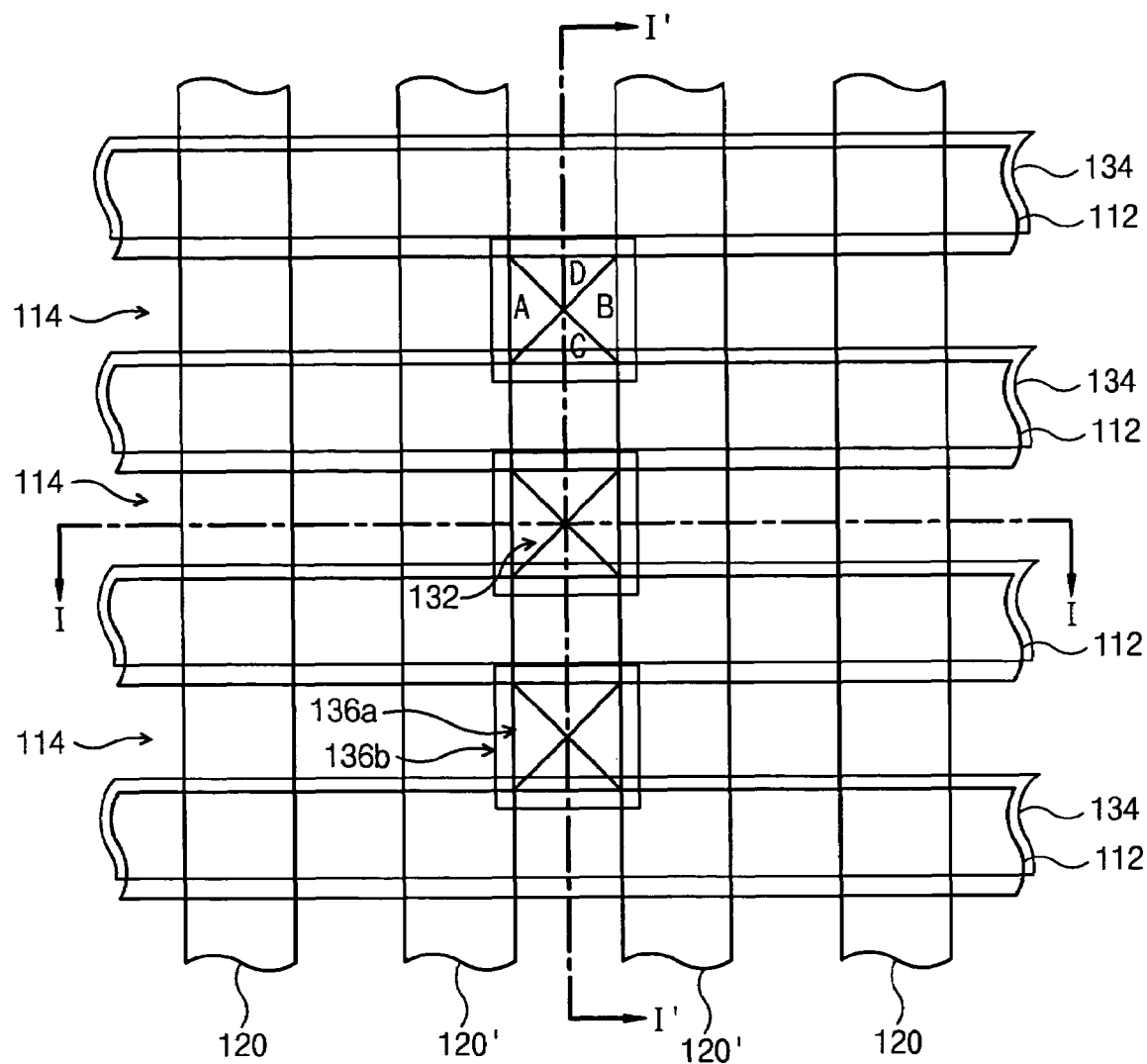
FIG. 2A is a partial plan view showing a cell array of a semiconductor device that has a SAC structure according to some embodiments of the present invention.
Figure 2B:
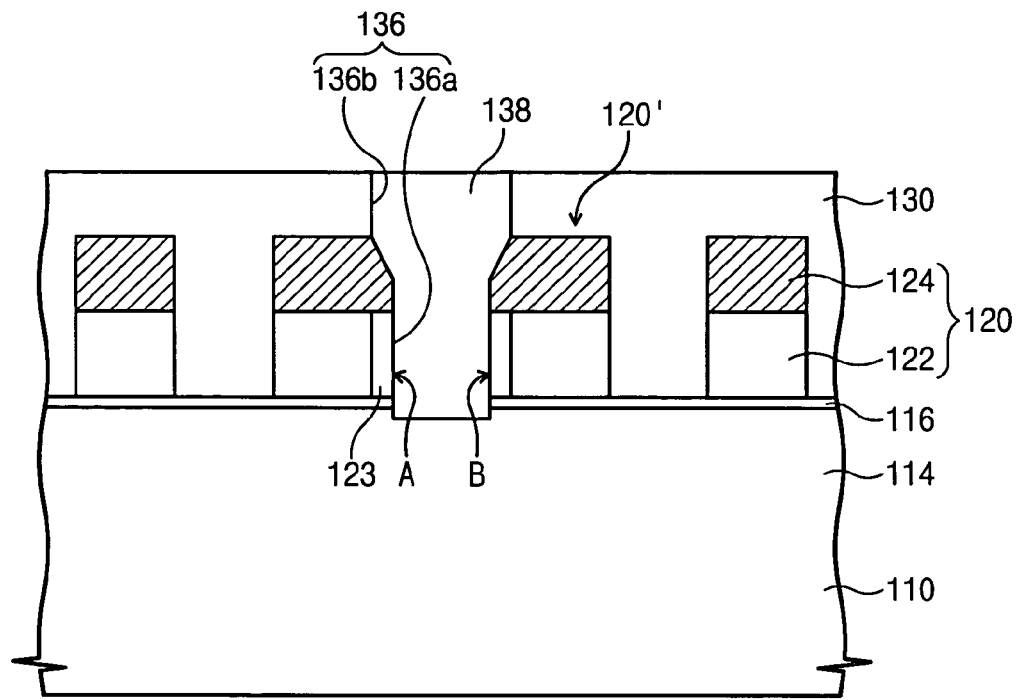
FIGS. 2B and 2C are sectional views taken along lines I-I and I'-I' of FIG. 2A, respectively.
Figure 2C:
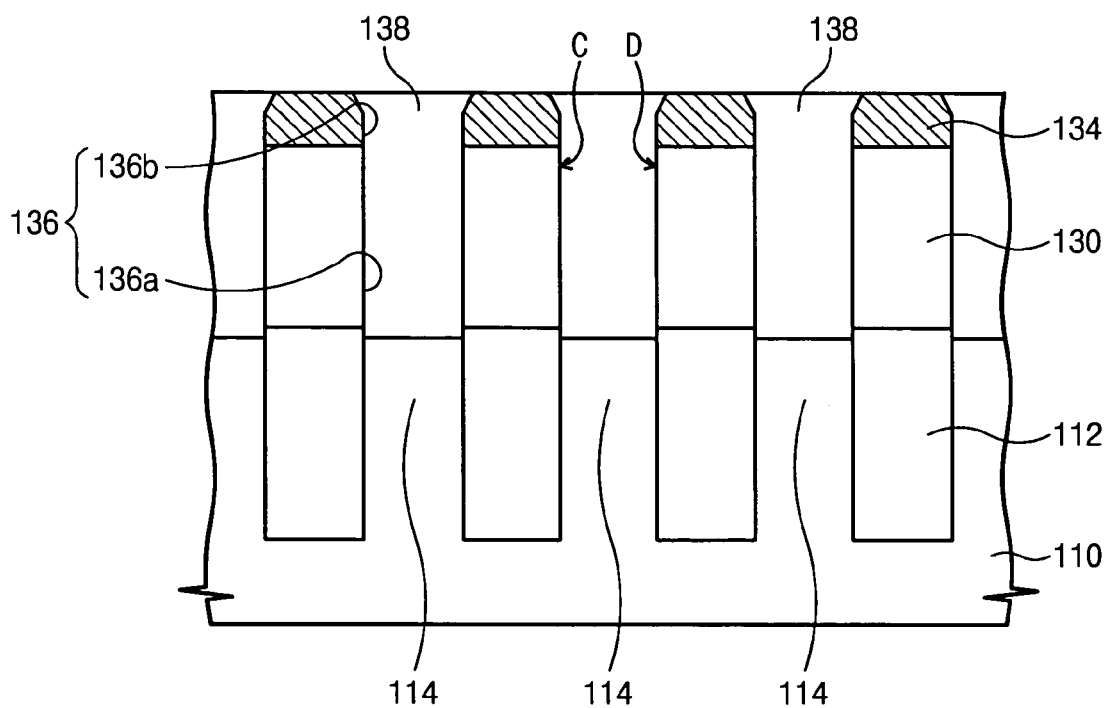

FIG. 2A is a partial plan view showing a cell array of a semiconductor device that has a SAC structure according to some embodiments of the present invention, and FIGS. 2B and 2C are sectional views taken along lines I-I and I'-I' of FIG. 2A, respectively;

Referring to FIGS. 2A through 2C, device isolation layers 112 are formed on a semiconductor substrate 110 to define a plurality of active regions 114. A plurality of word lines 120 formed on the semiconductor substrate 110 across the active regions 114 and the device isolation layers 112. The word lines 120 extend in a first direction and are spaced a predetermined distance apart from one another.

The word lines 120 are gate structure patterns having gates 122 and first mask patterns 124 that are stacked on a gate insulating layer 116 on the semiconductor substrate 110. The gate insulating layer 116 may include a tunnel insulating layer, a trap insulating layer, and a blocking insulating layer. The gate 122 may be a stacked gate having a floating gate, an inter-gate dielectric layer, and a control gate. Select lines 120' having the same structure as the word lines 120 are disposed between the word lines 120. Since the select lines 120' may include sidewall insulating layers 123 formed on sidewalls of gates, the width of the gates of the select lines 120' can be reduced by the width of the sidewall insulating layer 123. To prevent this, the select lines 120' may be provided to have a wider width than the word lines 120. However, the present invention is not limited to the above-described structure. Bit line contact plugs 138 are connected to drain regions provided on the semiconductor substrate 110 between the select lines 120'. Source and drain regions (not shown) may be provided on both sides of the word lines 120 to form cell transistors.

An interlayer insulating layer 130 is provided on the entire surface of the semiconductor substrate 110 to cover the word lines 120 and the select lines 120'. The interlayer insulating layer 130 may include a silicon oxide layer.

A plurality of second mask patterns 134 is provided the interlayer insulating layer 130. The second mask patterns 134 extend in a second direction across the first direction and are spaced apart from one another. The second mask patterns 134 may be provided in alignment with the device isolation layers 112. An additional interlayer insulating layer may be provided on the second mask patterns 134.

Contact holes 136 are provided through the interlayer insulating layer 130 and self-aligned with the first mask patterns 124 and the second mask patterns 134. For example, each of the contact holes 136 is formed in a contact region 132 defined by a neighboring pair of the first mask patterns 124 and a neighboring pair of the second mask patterns 134. The contact hole 136 may be divided into a first contact hole 136a and a second contact hole 136b. The first contact hole 136a is formed in the interlayer insulating layer 130 between a neighboring pair of the first mask patterns 124 to the semiconductor substrate 10 to expose the semiconductor substrate 110, and the second contact hole 136b is formed between the second mask patterns 134 in connection with an upper portion of the first contact hole 136a.

The first contact hole 136a is defined by a first sidewall (A), a second sidewall (B), a third sidewall (C), and a fourth sidewall (D). The first sidewall (A) is self-aligned with a surface of a first mask pattern 124 in the first direction, and the second sidewall (B) is self-aligned with a surface of a neighboring first mask pattern 124 and faces the first sidewall (A) in parallel. The third sidewall (C) is formed in the second direction, and the fourth sidewall (D) is spaced apart from the third sidewall (C) in parallel with the third sidewall (C). The third sidewall (C) is self-aligned with a surface of a second mask pattern 134, and the fourth sidewall (D) is self-aligned with a surface of a neighboring second mask pattern 124 and faces the third sidewall (C) in parallel. The third and fourth sidewalls (C) and (D) may be self-aligned with the device isolation layers 112.

Meanwhile, the second contact hole 136b can have a sloped structure with an upper portion larger than a lower portion, like a funnel. The second contact hole 136b may be larger than the first contact hole 136a.

The sidewall insulating layers 123 may be provided between the sidewalls (A) and (B) of the first contact hole 136a and the gates 122 provided under the first mask patterns 124. The sidewall insulating layers 123 may be a silicon oxide layer. Preferably, the sidewall insulating layers 123 may be formed by oxidizing the gates 122 formed of polysilicon. Further, each of the sidewall insulating layers 123 may include a silicon oxide layer formed along a sidewall of the gates 122, and a silicon nitride layer contacting the sidewall of the first contact hole 136a. Meanwhile, an insulating spacer layer may be additionally provided on the sidewall of the contact hole 136. Owing to this structure, a short circuit can be prevented between the gates 122 and the contact plug 138 formed in the contact hole 136 using a conductive material.

Meanwhile, the first and second mask patterns 124 and 134 may function as an etch stop layer having etch selectivity to when the interlayer insulating layer 130 formed of a silicon oxide is etched. The etch stop layer may be a silicon nitride layer, a multi layer of silicon oxide/silicon nitride, or an undoped polysilicon layer.

Figure 3A:
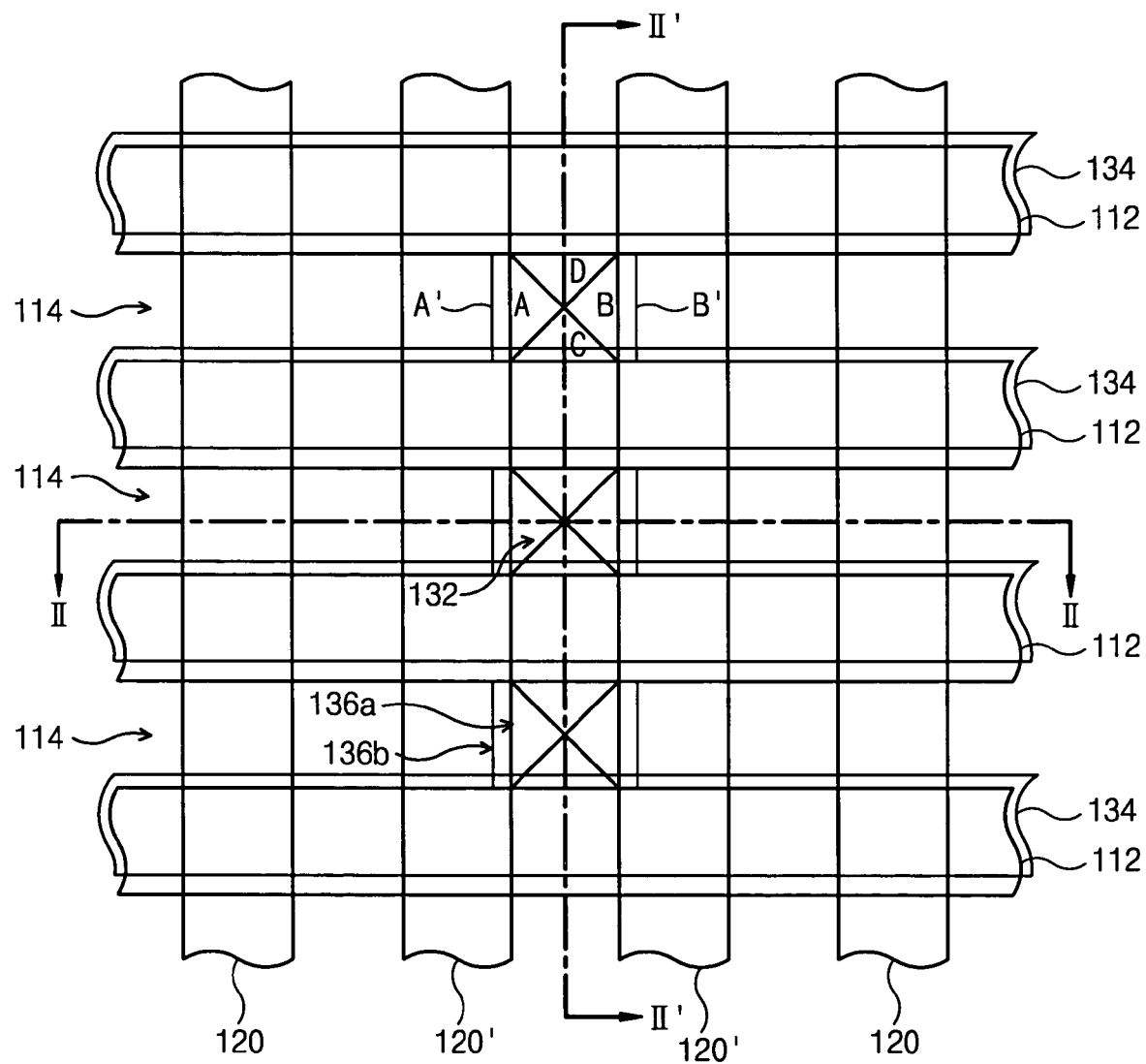
FIG. 3A is a partial plan view showing a cell array of a semiconductor device that has a SAC structure according to some embodiments of the present invention.
Figure 3B:
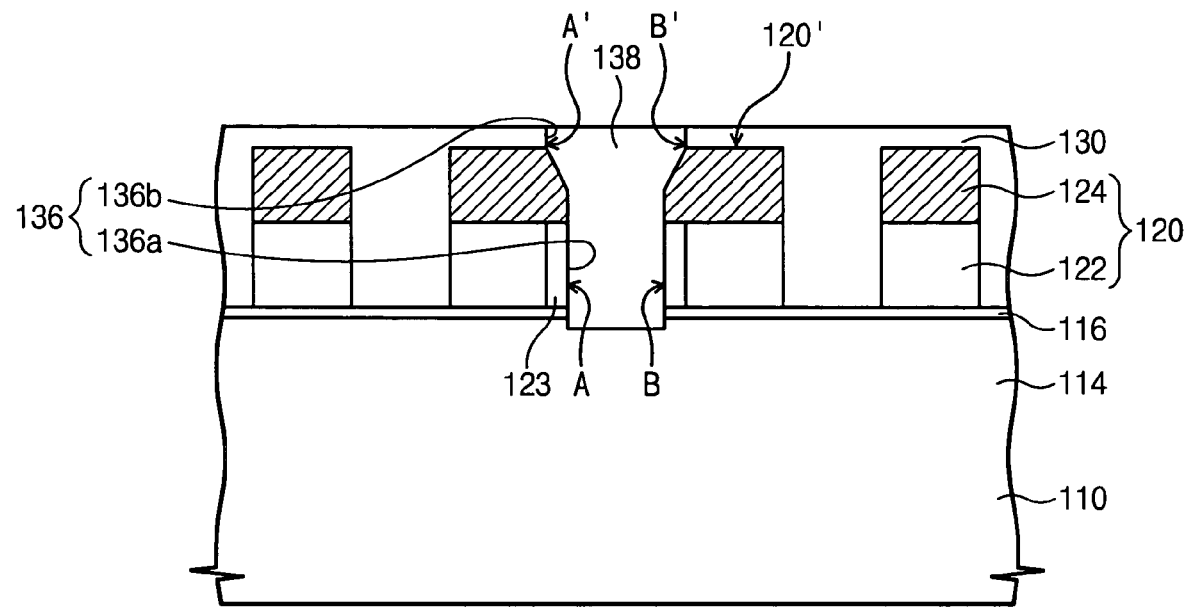
FIGS. 3B and 3C are sectional views taken along lines II-II and II'-II' of FIG. 3A, respectively.
Figure 3C:
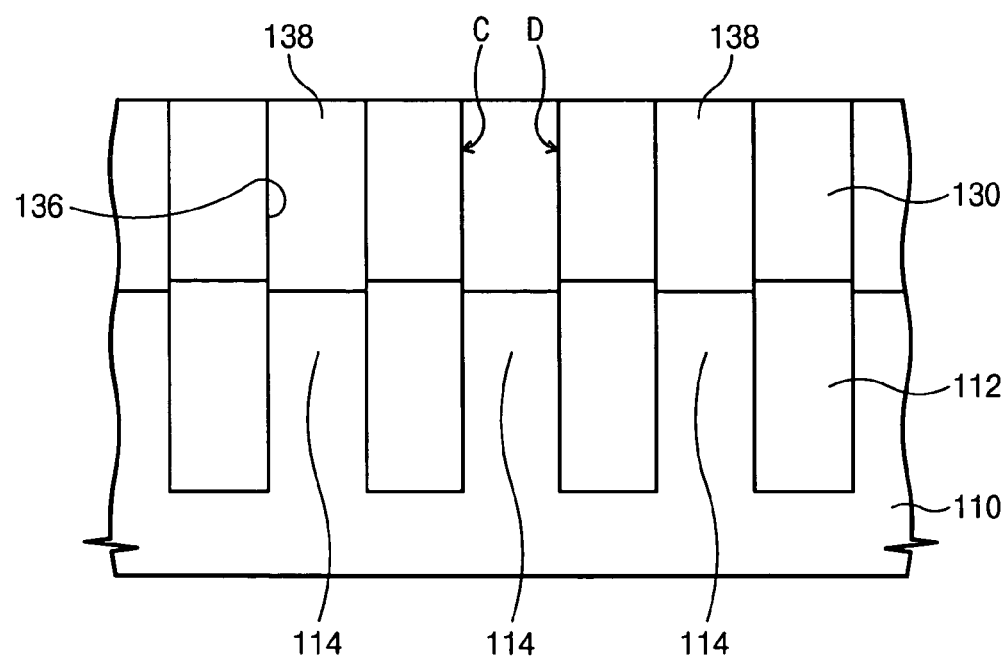

FIG. 3A is a partial plan view showing a cell array of a semiconductor device that has a SAC structure according to some embodiments of the present invention, and FIGS. 3B and 3C are sectional views taken along lines II-II and II'-II' of FIG. 3A, respectively;

Referring to FIGS. 3A through 3C, in the current embodiment, the second mask patterns 134 can be removed from the SAC structure shown in FIGS. 2A through 2C. Although the second mask patterns 134 have a good effect on forming the SAC structure, the second mask patterns 134 may have a bad effect on device planarization, integration, etc. The second mask patterns 134 may be removed by chemical mechanical polishing (CMP). Alternatively, other methods such as overall dry or wet etching can be used for removing the second mask patterns.

When the second mask patterns 134 are removed, the second contact holes 136b are partially removed. In the current embodiment, the second contact hole 136b is defined by a fifth sidewall (A') parallel to the first sidewall (A), a sixth sidewall (B') parallel to the second sidewall (B'), the third sidewall (C), and the fourth sidewall (D). Since a self-aligning mask does not exist in the second direction, the fifth sidewalls (A') and the sixth sidewall (B') can be disposed outside the first sidewall (A) and the second sidewall (B), respectively. Accordingly, the second contact hole 136b may be larger than the first contact hole 136a. The first contact hole 136a may have a polygonal cross section defined by the first and second mask patterns 124 and 134, and the second contact hole 136b may have a rectangular cross section with long sides in the direction along the second mask patterns 134. However, the cross sectional shapes of the first contact hole 136a and the second contact hole 136b can vary from the polygon or rectangle shape to an elliptical shape during etching.

Figure 4A:
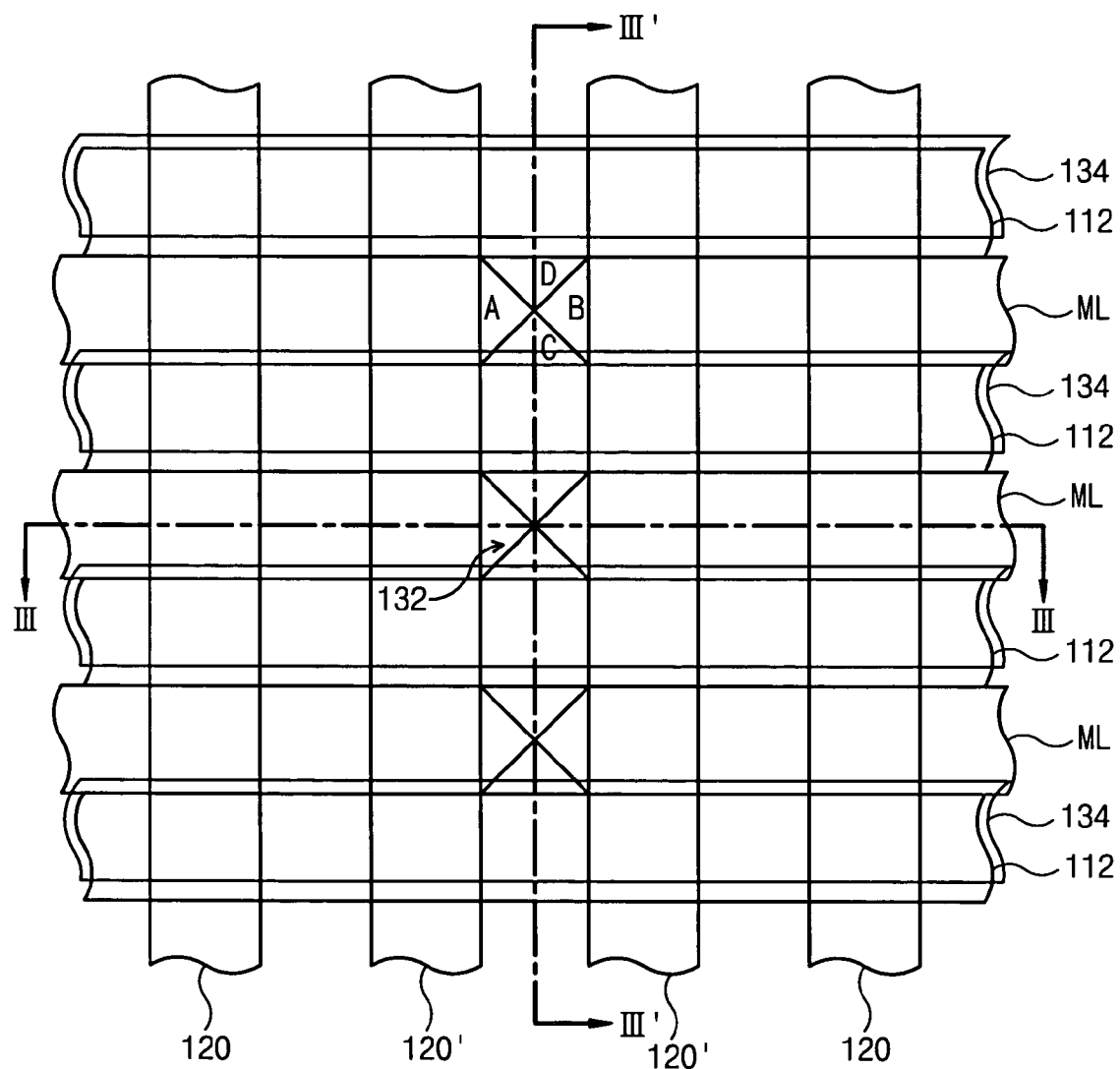
FIG. 4A is a partial plan view showing a cell array of a semiconductor device that has a SAC structure according to some embodiments of the present invention.
Figure 4B:
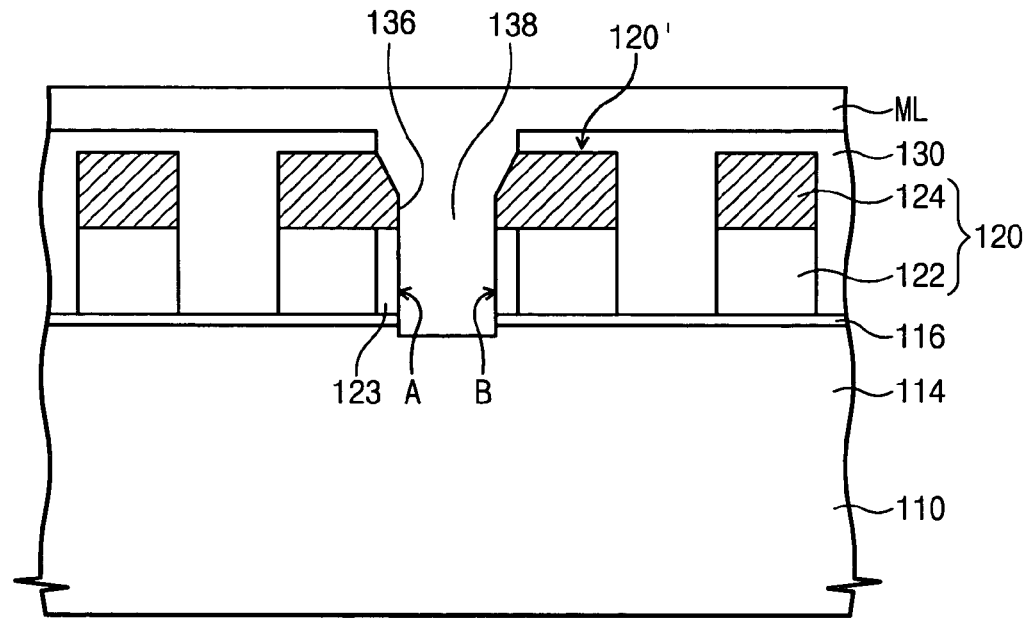
FIGS. 4B and 4C are sectional views taken along lines III-III and III'-III' of FIG. 3A, respectively.
Figure 4C:
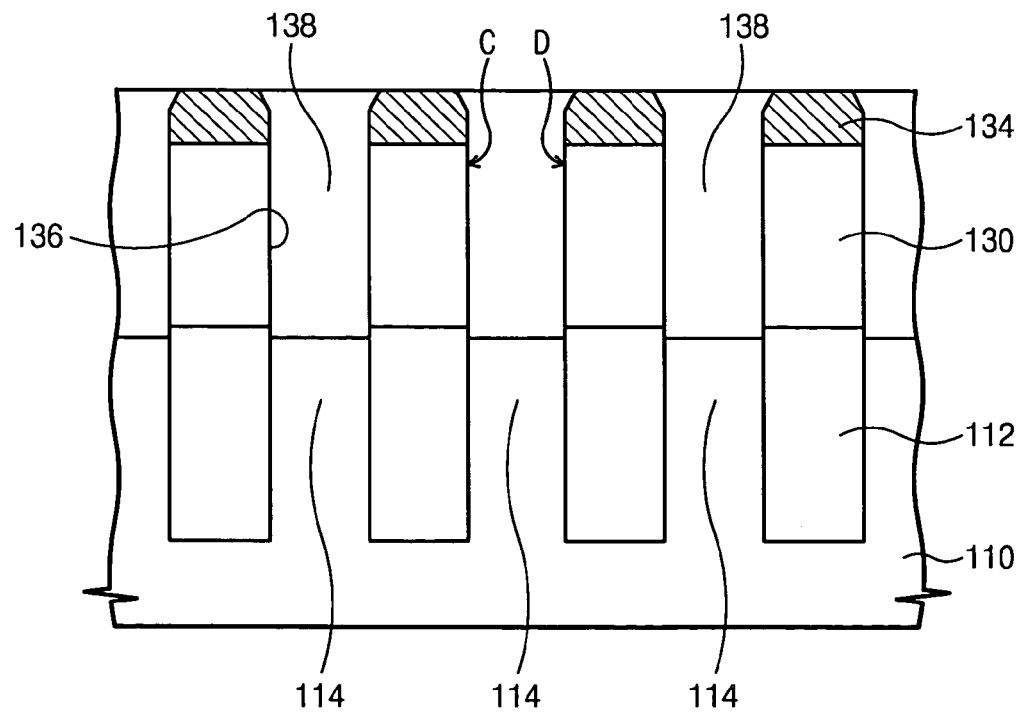

FIG. 4A is a partial plan view showing a cell array of a semiconductor device that has a SAC structure according to some embodiments of the present invention, and FIGS. 4B and 4C are sectional views taken along lines III-III and III'-III' of FIG. 3A, respectively;

Referring to FIGS. 4A through 4C, the second contact hole 136b connected to the upper portion of the first contact hole 136a in the SAC structure shown in FIGS. 2A through 2C does not exist in the SAC structure of the current embodiment, or a lower portion of the second contact hole 136b exists. Metal lines ML are electrically connected to the contact plug 138 that is filled in the first contact hole 136a as a conductive layer. Each of the metal lines ML is formed between a pair of the second mask patterns 134 and aligned with the pair of second mask patterns 134. The metal lines ML extend in the second direction. The metal lines ML may be used as bit lines.

A method of forming a SAC structure will now be described by taking the SAC structure shown in FIGS. 2A through 2C as an main example.

Figure 5A:
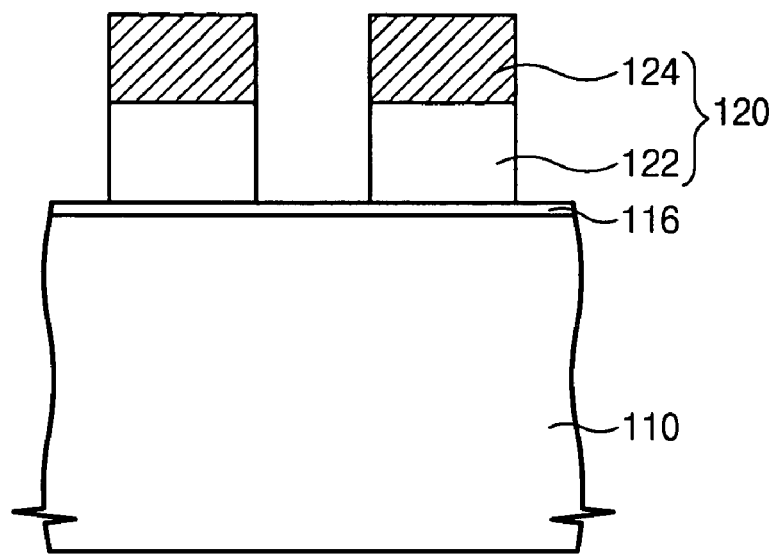
FIGS. 5A through 12B are views for explaining a process of forming a SAC structure according to some embodiments of the present invention.

FIGS. 5A through 12B are views for explaining a process of forming a SAC structure according to some embodiments of the present invention. FIGS. 5A, 6A, 7A, ..., and 12A are views for explaining the SAC structure forming process with respect to the section taken along line I-I of FIG. 2A, and FIGS. 5B, 6B, 7B, ..., and 12B are views for explaining the SAC structure forming process with respect to the section taken along line I'-I' of FIG. 2A. In FIGS. 5A through 12B, a contact region is only shown for clarity.

Figure 5B:
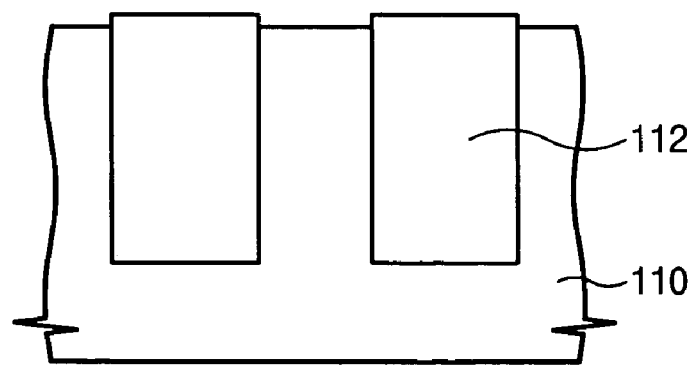

Referring to FIGS. 5A and 5B, a gate insulating layer 116, a gate conductive layer, and first mask patterns 124 are sequentially formed on a semiconductor substrate 110. The gate conductive layers may be formed of polysilicon, and the gate insulating layer 116 may be formed of a silicon oxide.

Gates 122 are formed in self-alignment to the first mask patterns 124 by etching the gate conductive layers using the first mask patterns 124 as a etch mask. A plurality of gate structure patterns 120 are formed by the stacked gates 122 and the first mask patterns 124. The gate structure patterns 120 extend in a first direction and are spaced apart from each other. The first mask patterns 124 may be an etch stop layer having an etch selectivity for etching a silicon oxide layer (described later). The etch stop layer may be a silicon nitride layer, a stacked layer of a silicon oxide layer and a silicon nitride layer, or an undoped poly silicon layer.

In addition, insulating spacer layers (not shown) may be formed on sidewalls of the gates 122 or the gate structure patterns 120. The insulating spacer layers may be formed of silicon nitride. The insulating spacer layers may be formed by depositing an insulating layer over the gate structure patterns 120 and etching the deposited insulating layer. The insulating spacer layers function as a etch mask or an etch stop layer together with the first mask patterns 124 when an interlayer insulating layer is etched. The insulating spacer layers are not shown to keep the drawings simple for illustrative/practical purpose.

Meanwhile, prior to the forming of the gate structure patterns 120, device isolation layers 112 are formed on the semiconductor substrate 110 in a second direction crossing the first direction to define active regions. The first direction and the second direction may cross at a right angle.

Figure 6A:
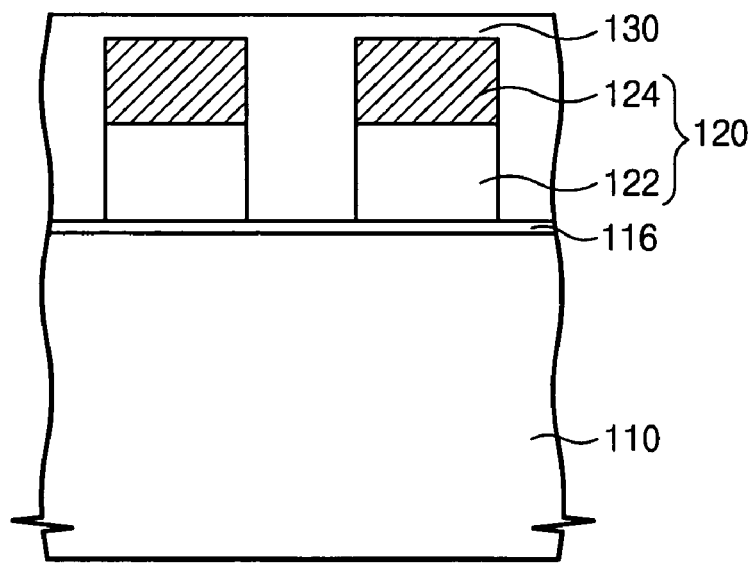
Figure 6B:
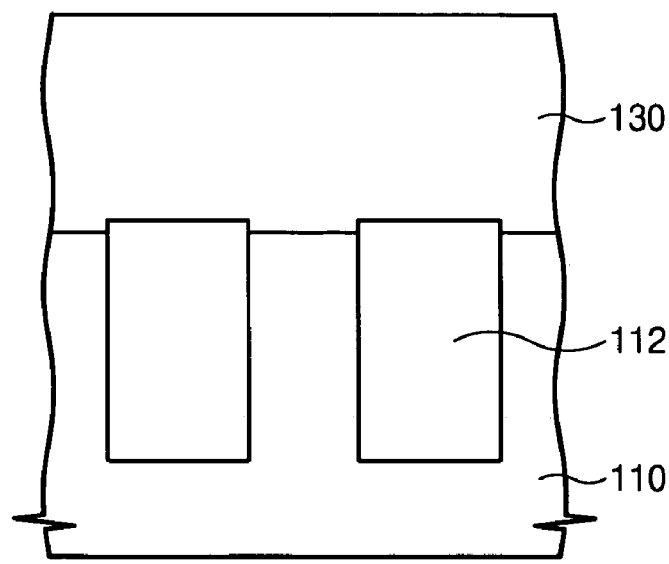

Referring to FIGS. 6A and 6B, an interlayer insulating layer 130 is deposited to cover the plurality of gate structure patterns 120. The interlayer insulating layer 130 may be a silicon oxide layer and may be planarized.

Figure 7A:
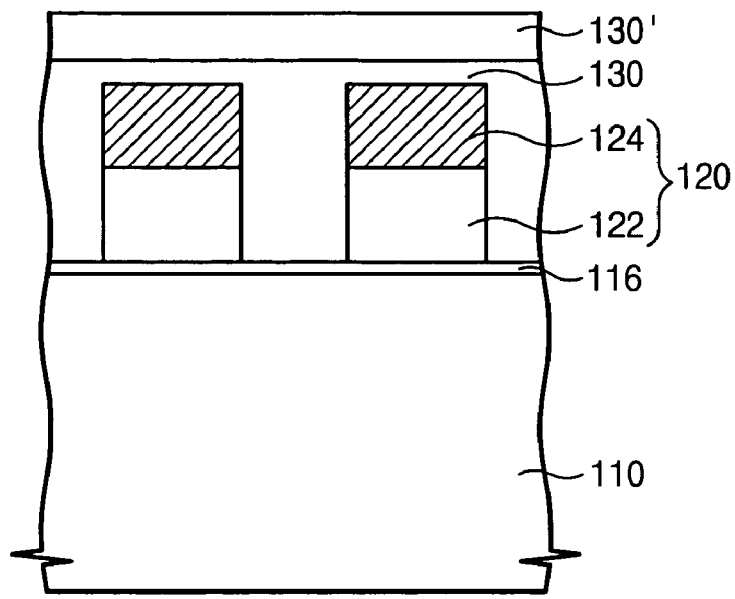
Figure 7B:
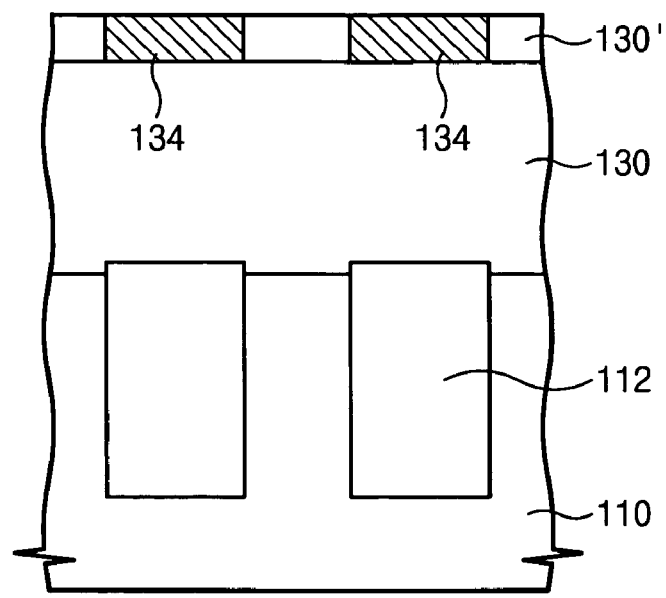

Referring to FIGS. 7A and 7B, a plurality of second mask patterns 134 is formed on the interlayer insulating layer 130. The second mask patterns 134 extend in the second direction across the first direction and spaced apart from each other. The second mask patterns 134 may be aligned with the device isolation layers 112. In this case, the second mask patterns 134 can be formed using the same reticle as the device isolation layers 112 without using an additional reticle.

The second mask patterns 134 may be an etch stop layer having etch selectivity for etching the interlayer insulating layer 130 formed of a silicon oxide. The etch stop layer may be a silicon nitride layer, a stacked layer with a silicon oxide layer and a silicon nitride layer, or a polysilicon layer. After that, another interlayer insulating layer 130' can be formed to cover the second mask patterns 134, and the overall planarization can be performed. Alternatively, instead of planarizing the interlayer insulating layer 130' covering the second mask patterns 134, third mask patterns can be further formed on the interlayer insulating layer 130' in alignment with the first mask patterns 124 across the second mask patterns 134.

Figure 8A:
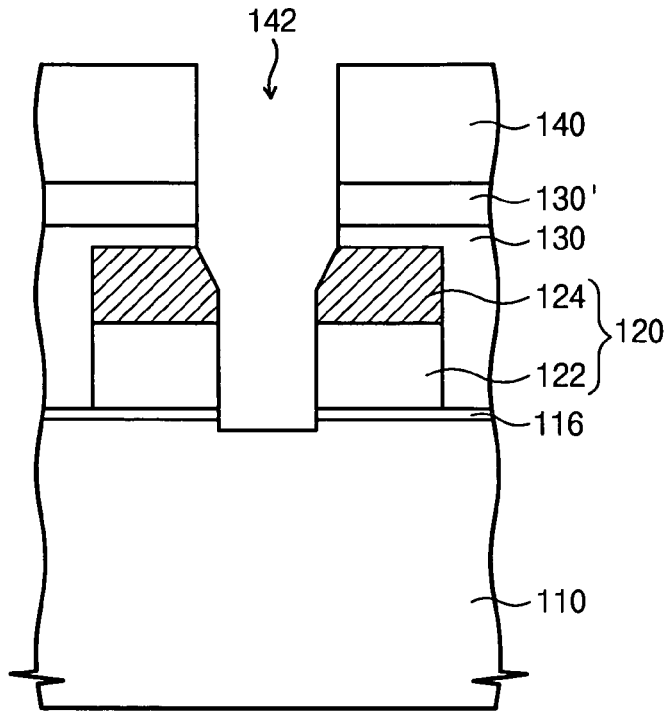
Figure 8B:
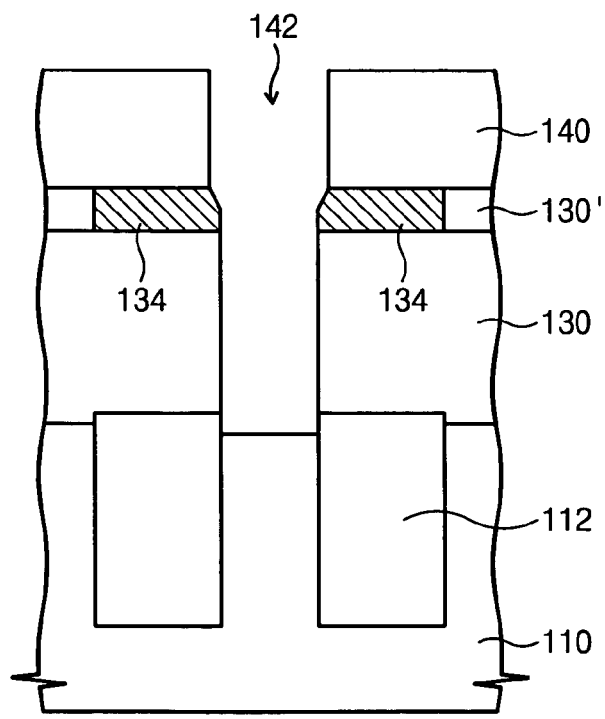

Referring to FIGS. 2A, 8A, and 8B, the interlayer insulating layer 130 (130') is coated with photoresist, and the photoresist is patterned by exposing to form a photoresist pattern 140. The photoresist pattern 140 includes an opening 142 to expose the interlayer insulating layer 130 at least one contact region 132 defined by a neighboring pair of the first mask patterns 124 and a neighboring pair of the second mask patterns 134. A contact hole will be formed at the contact region 132 where the opening 142 is formed.

The interlayer insulating layer 130 (130') is etched using the photoresist pattern 140 to expose the semiconductor substrate 110. The exposed portion of the semiconductor substrate 110 may be in the active region 114. The opening 142 of the photoresist pattern 140 can have a larger size than the contact region 132. The contact hole may have a sloped shape like a funnel having an upper portion wider than a lower portion. In this case, a contact plug material can be deposited in the contact hole more easily, and the contact plug can be connected to an upper portion or another contact plug more easily. Meanwhile, impurity ions can be implanted into the exposed surface of the semiconductor substrate 110 through the contact hole to form an impurity region additionally.

Figure 9A:
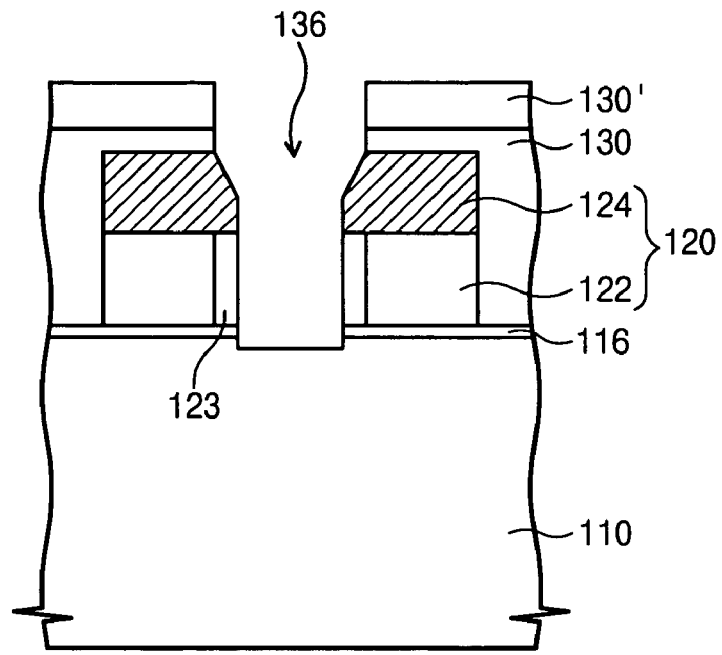
Figure 9B:
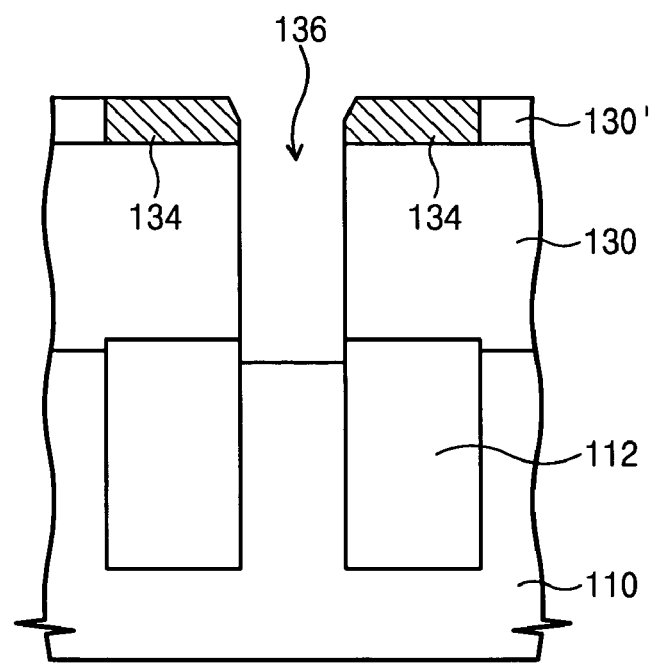

Referring to FIGS. 9A and 9B, the photoresist pattern 140 is removed, and sidewalls of the gates 122 exposed by the contact hole 136 can be oxidized. When the gates 122 are formed of polysilicon, thin silicon oxide layers 123 can be formed on the sidewalls of the gates 122 to protect the gates 122. The sidewall silicon oxide layers 123 can be formed before the contact hole 136 is formed. For example, referring to FIG. 5A, after the gate conductive layer 122 is patterned using the first mask patterns 124 to form the gates 122, the exposed sidewalls of the gates 122 can be oxidized. In this case, silicon oxide layers can be formed on all the sidewalls of the gates 122 as well as the sidewalls of the gates 122 facing the contact hole 136. The silicon oxide layers 123 of the gates 122 prevent a short circuit between the gates 122 and a contact plug to be filled in the self-aligned contact hole 136. Meanwhile, when the insulating spacer layers are formed as described in FIGS. 5A and 5B, the silicon oxide layers 123 may be not formed.

Figure 10A:
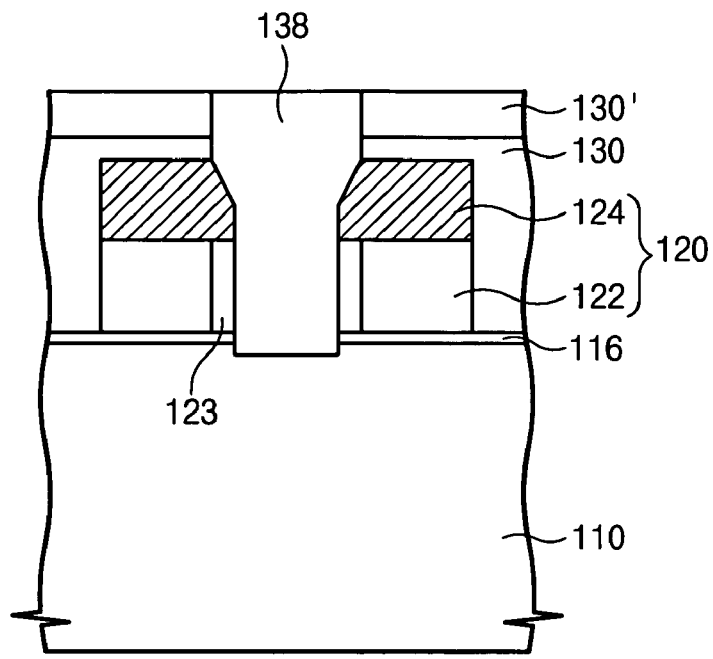
Figure 10B:
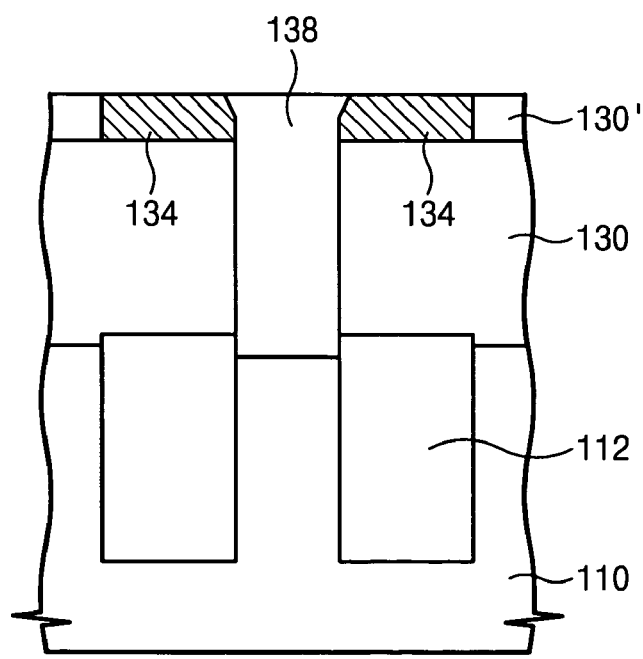

Referring to FIGS. 10A and 10B, a conductive material is deposited to form a contact plug 138. The contact plug 138 forms a conductive layer filling the contact hole 136 self-aligned with the first mask patterns 124 and the second mask patterns 134. The contact plug may be formed of polysilicon or a Ti/TiN/W multiplayer. The conductive material may be deposited to cover the second mask patterns 134. In this case, the deposited conductive material may be removed to the contact hole 136 by an etch process using a photoresist pattern or a polishing process such as CMP, such that the contact plug material can remain only at the contact hole 136. In this way, the SAC structure shown in FIGS. 2A through 2C is formed.

Figure 11A:
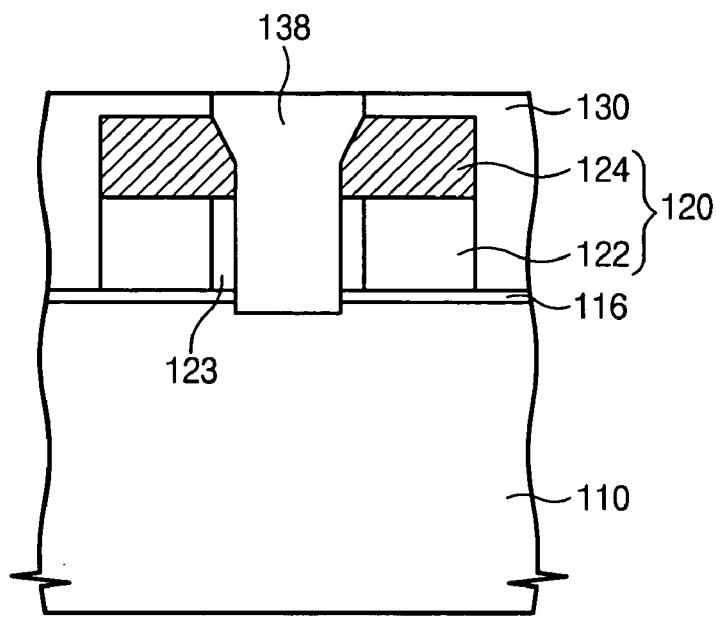
Figure 11B:
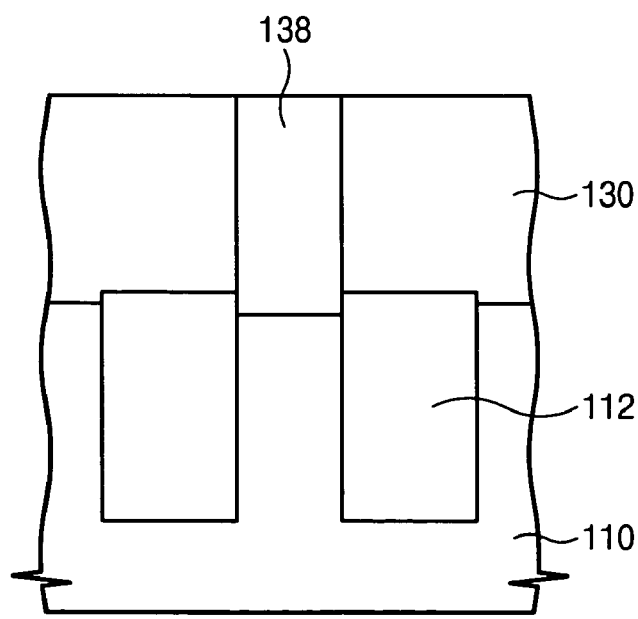

Further, referring to FIGS. 11A and 11B, the second mask patterns 134 and a portion of the contact plug material can be removed by, for example, CMP. Since the CMP for polishing a conductive material is a well-known semiconductor process, description for the CMP will be omitted. In this way, the SAC structure shown in FIGS. 3A through 3C can be obtained.

Figure 12A:
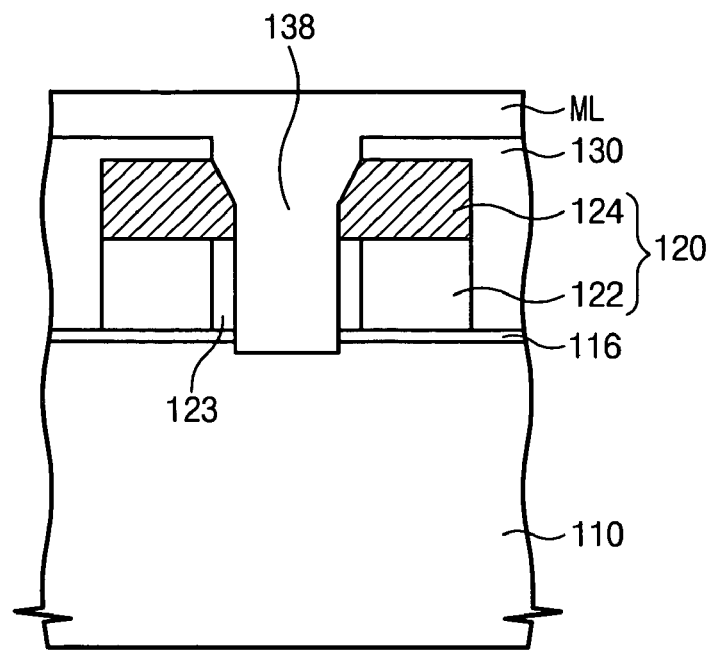
Figure 12B:
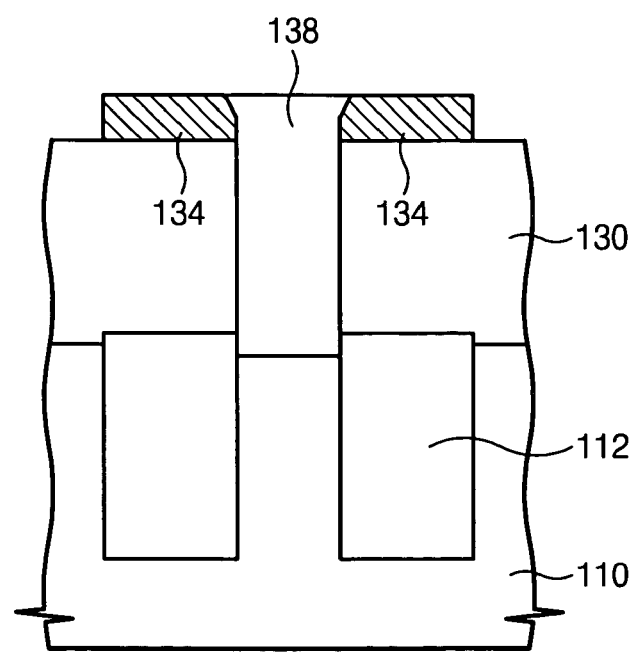

Meanwhile, referring again to FIGS. 7A and 7B, the process of forming the SAC structure may not include the forming of the additional interlayer insulating layer 130'. Then, the contact hole 136 is formed as shown in FIGS. 8A, 8B, 9A, and 9B. Referring to FIGS. 12A and 12B, a conductive material is filled in the contact hole 136 self-aligned with the first mask patterns 124 and the second mask patterns 134 in order to form the contact plug 138. The contact plug 138 may be formed by deposition using several conductive materials into a Ti/TiN/W multi-layer. The deposited conductive materials may cover the second mask patterns 134. Then, the conductive materials formed on top of the second mask patterns 134 are removed by polishing such as CMP to expose the second mask patterns 134. Since the CMP is a well-known semiconductor process for polishing a conductive material, detailed description of the CMP will be omitted. Since the conductive material exists only between the second mask patterns 134, the conductive material can be formed in parallel with the second mask patterns 134, and then it can be patterned. The patterned conductive material may be used as a bit line. In this way, the SAC structure shown in FIGS. 4A through 4C can be obtained.

A method of forming a SAC structure will now be described with reference to FIGS. 13A through 17B according to other embodiments of the present invention.

Figure 13A:
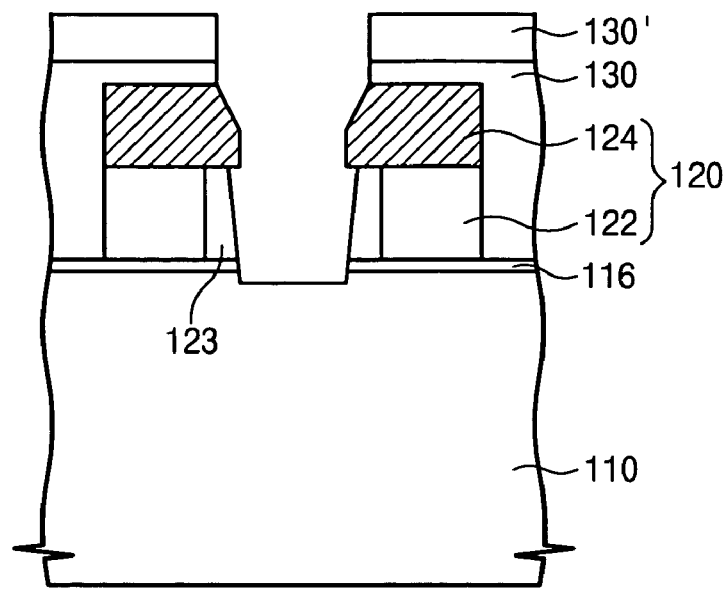
FIGS. 13A through 17B are views for explaining a SAC structure according to some embodiments of the present invention.

FIGS. 13A through 17B are views for explaining methods of forming the SAC structure according to some embodiments of the present invention. FIGS. 13A, 14A, . . . , and 17A are sectional views related with the section taken along line I-I of FIG. 2A, and FIGS. 13B, 14B, . . . , and 17B are sectional views related with the section taken along line I'-I' of FIG. 2A. In FIGS. 13A through 17B, a contact region is only shown for clarity.

Figure 13B:
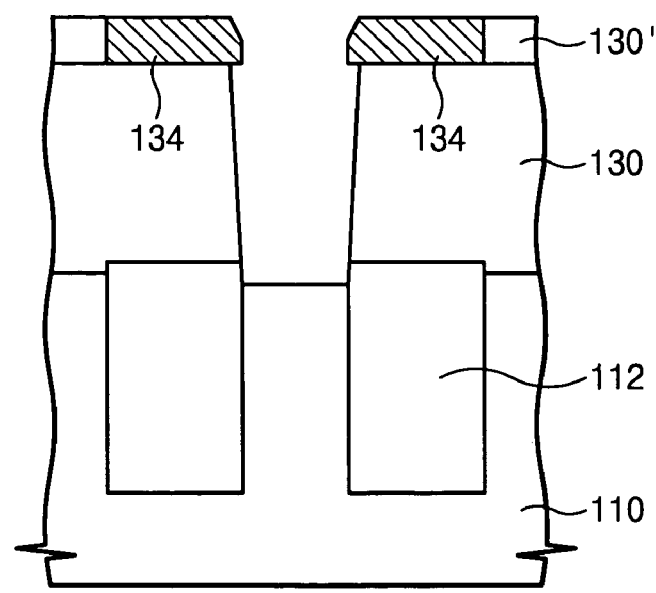

Referring to FIGS. 13A and 13B, the exposed silicon oxide layers of the sidewalls of the contact hole 136 shown in FIGS. 9A and 9B are wet-etched to form undercuts under the first mask patterns 124 and the second mask patterns 134. Thus, protruded jaws can be formed at the middle of a contact plug to be formed in the contact hole 136. The protruded jaws prevent the contact plug from being separated from the contact hole 136 by electric stresses and thermal stresses resulted from different thermal expansion coefficients of stacked thin layers.

Figure 14A:
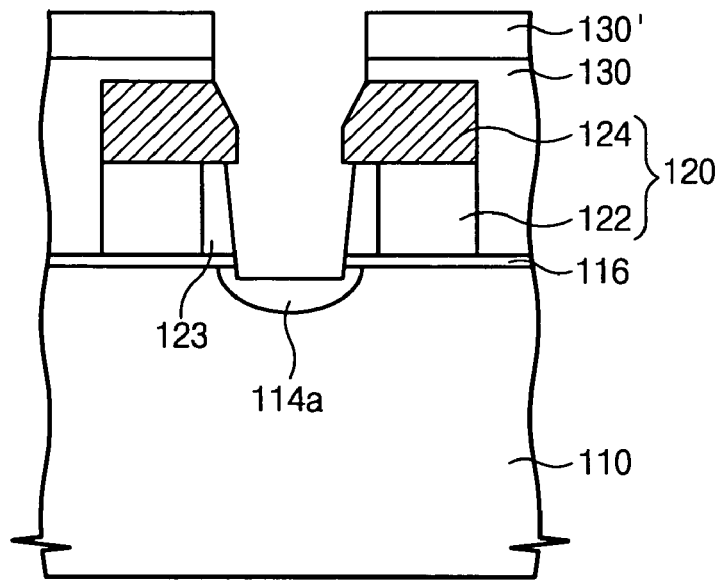
Figure 14B:
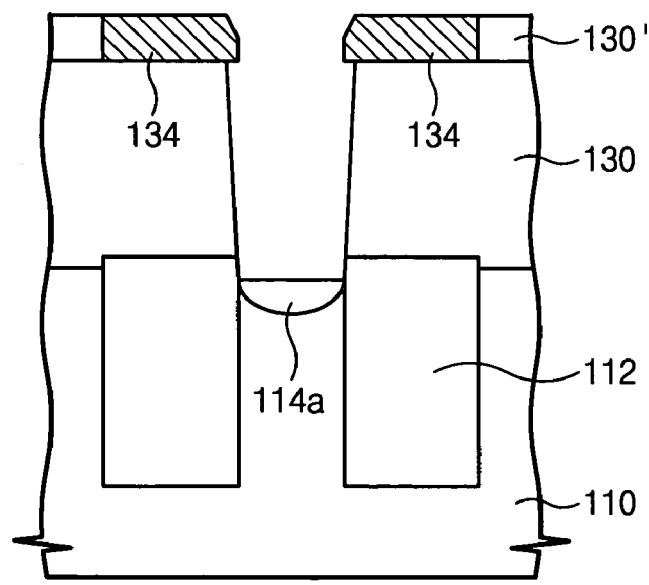

Referring to FIGS. 14A and 14B, impurity ions are implanted into the semiconductor substrate 110 exposed by the contact hole 136 to form an additional impurity region 114a. In a high-density integrated flash memory device, source/drain junction regions have a very low concentration and thin thickness and thus junction characteristics can be unstable. However, the junction characteristics can be improved by additionally implanting impurity ions after the self-aligned contact hole 136 is formed as described above.

Figure 15A:
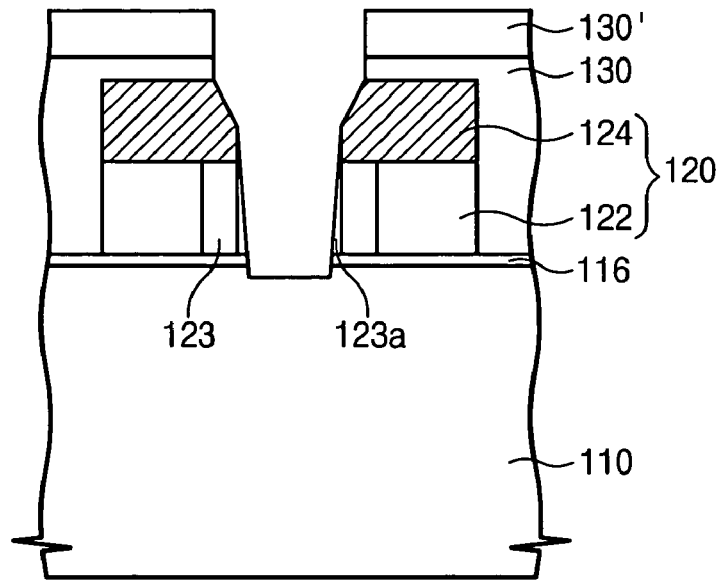
Figure 15B:
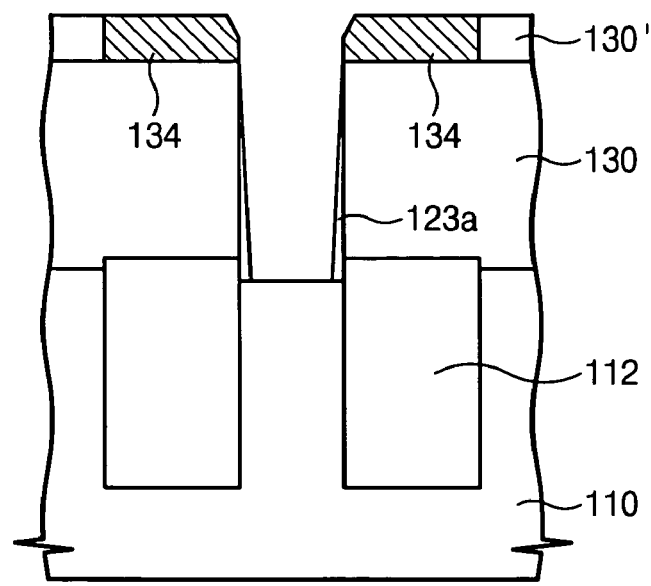
Figure 16A:
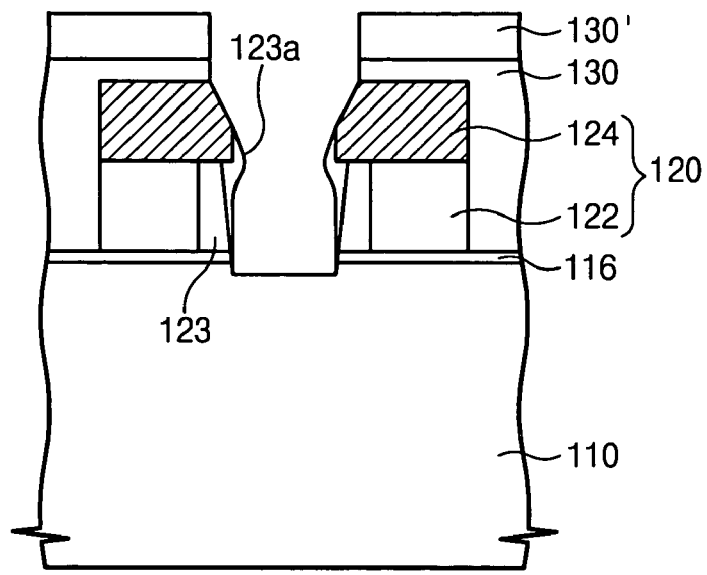
Figure 16B:
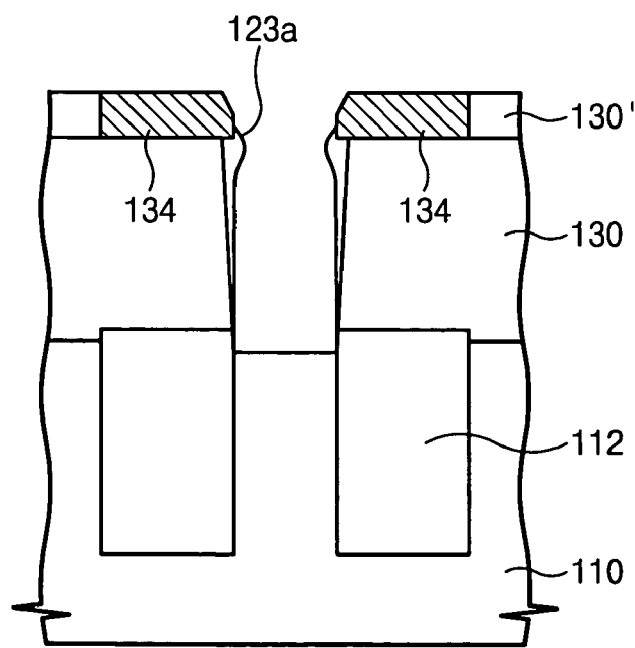

Referring to FIGS. 15A and 15B, insulating spacer layers 123a can be additionally formed on the inner walls of the contact hole 136. The insulating spacer layers 123a may be formed of silicon nitride. After depositing silicon nitride in the contact hole 136, overall etchback is performed on the deposited nitride to form the insulating spacer layers 123a only on the sidewall of the contact hole 136. Electric characteristics can be improved between the contact plug to be filled in the self-aligned contact hole 136 and the gates 122, and between neighboring contact plugs. Referring to FIGS. 16A and 16B, the insulating spacer layers 123a can be formed after the contact hole 136 is wet-etched to form undercuts as well as immediately after the contact hole 136 is formed.

Figure 17A:
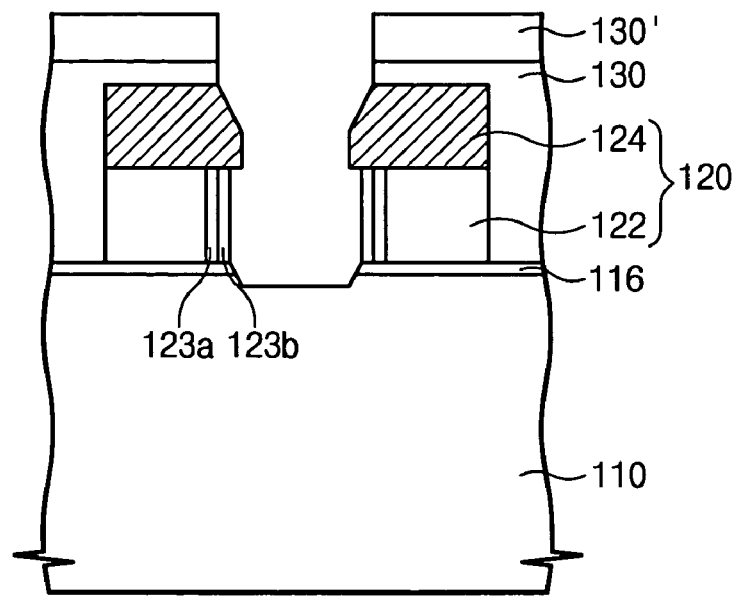
Figure 17B:
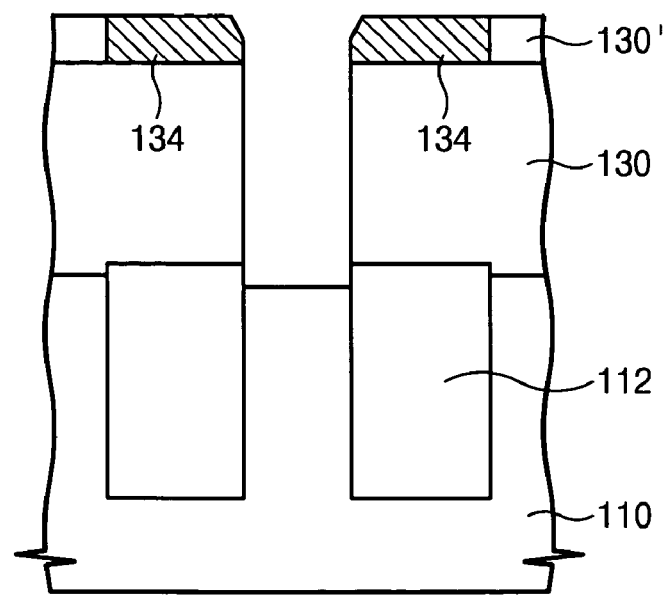

Meanwhile, referring to FIGS. 17A and 17B, silicon oxide layers 123a and liner layers 123b may be formed on the sidewalls of the gates 122. The liner layers 123b may be formed of silicon nitride. In this way, the contact hole 136 is completely formed.

As described above, according to the present invention, the SAC holes can be formed both along and across gate lines. Therefore, even when a photoresist pattern is misaligned, the SAC holes can be formed at desired positions, thereby improving electrical insulation between contact plugs.

Further, the insulating layers are additionally formed in the contact plug, so that insulation characteristics can be maintained at a stable state without degradation between the self-aligned contact plug and neighboring conductive lines such as the gate lines.

It will be apparent to those skilled in the art that various modifications and variations can be made in the present invention. Thus, it is intended that the present invention covers the modifications and variations of this invention provided they come within the scope of the appended claims and their equivalents.

What is claimed:

1. A semiconductor device comprising:
   a semiconductor substrate;
   a plurality of device isolation layers defining active regions on the semiconductor substrate;
   a plurality of gate structure patterns having gates and first mask patterns stacked on the semiconductor substrate, the gate structure patterns being spaced apart from each other and extending in a first direction;
   an interlayer insulating layer covering the gate structure patterns;
   a plurality of second mask patterns on the interlayer insulating layer, the second mask patterns extending in a second direction and spaced apart from each other; and
   a conductive layer in at least one contact hole defined by a neighboring pair of the first mask patterns and a neighboring pair of the second mask patterns, the contact hole being self-aligned to the first mask patterns and to second mask patterns.

2. The semiconductor device of claim 1, wherein the gate structure patterns comprise select line patterns of a nonvolatile memory device.

3. The semiconductor device of claim 1, wherein the device isolation layers extend in the second direction aligned to the second mask patterns.

4. The semiconductor device of claim 1, further comprising sidewall insulating layers between sidewalls of the contact hole and the gates.

5. The semiconductor device of claim 4, wherein the sidewall insulating layers comprise silicon oxide layers.

6. The semiconductor device of claim 4, wherein each of the side wall insulating layers comprises:
   a silicon oxide layer along a sidewall of the gate; and
   a silicon nitride layer abutted on the sidewall of the contact hole.

7. The semiconductor device of claim 1, wherein the contact hole comprises an undercut beneath the first mask pattern.

8. The semiconductor device of claim 1, further comprising:
   an insulating spacer layer on an inner wall of the contact hole.

9. A semiconductor device comprising:
   a semiconductor substrate;
   a plurality of device isolation layers defining active regions on the semiconductor substrate;
   a plurality of gate structure patterns having gates and first mask patterns stacked on the semiconductor substrate, the gate structure patterns being spaced apart from each other and extending in a first direction;
   an interlayer insulating layer covering the gate structure patterns;
   a contact plug in a contact hole through the interlayer insulating layer that exposes the semiconductor device, wherein the contact hole includes a first contact hole provided at least between the first mask patterns and beneath the first mask patterns and a second contact hole provided in an upper portion of the first mask patterns in contact with the first contact hole;
   wherein the first contact hole has a first sidewall self-aligned to a surface of the first mask pattern in the first direction, a second sidewall self-aligned to a surface of a neighboring first mask pattern facing the first sidewall and parallel thereto, a third sidewall provided in a second direction crossing the first direction, and a fourth sidewall spaced apart from the third sidewall and parallel thereto; and wherein the second contact hole having a fifth sidewall outside the first sidewall, a sixth sidewall outside the second sidewall, and the third and fourth sidewalls, the second contact hole extending in the second direction.

10. The semiconductor device of claim 9, wherein the device isolation layers extend in the second direction, and the third and fourth sidewalls are aligned to the device isolation layers.

* * * * *